United States Patent
Sogabe et al.

(10) Patent No.: US 8,357,265 B2
(45) Date of Patent: Jan. 22, 2013

(54) CLEANING METHOD AND A VACUUM PROCESSING APPARATUS

(75) Inventors: Kouji Sogabe, Susono (JP); Naoki Morimoto, Susono (JP); Masahiko Ishida, Susono (JP)

(73) Assignee: ULVAC, Inc., Chigasaki-shi (JP)

( * ) Notice: Subject to any disclaimer, the term of this patent is extended or adjusted under 35 U.S.C. 154(b) by 0 days.

(21) Appl. No.: 12/269,438

(22) Filed: Nov. 12, 2008

(65) Prior Publication Data

US 2009/0120456 A1 May 14, 2009

Related U.S. Application Data

(63) Continuation of application No. PCT/JP2007/059718, filed on May 11, 2007.

(30) Foreign Application Priority Data

May 15, 2006 (JP) .................................. 2006-135436

(51) Int. Cl.
*H01L 21/00* (2006.01)
*C23C 16/00* (2006.01)

(52) U.S. Cl. ......... 156/345.51; 156/345.47; 156/345.43; 156/345.44; 156/915; 361/234; 279/128

(58) Field of Classification Search .................. 118/725, 118/728; 156/345.51, 345.52; 361/234; 279/128
See application file for complete search history.

(56) References Cited

U.S. PATENT DOCUMENTS

| | | | | |
|---|---|---|---|---|
| 4,771,730 A | * | 9/1988 | Tezuka | 118/723 E |
| 5,663,865 A | * | 9/1997 | Kawada et al. | 361/234 |
| 5,847,918 A | * | 12/1998 | Shufflebotham et al. | 361/234 |
| 5,959,409 A | * | 9/1999 | Dornfest et al. | 315/111.21 |
| 6,094,334 A | * | 7/2000 | Bedi et al. | 361/234 |
| 6,494,958 B1 | * | 12/2002 | Shamouilian et al. | 118/728 |
| 2003/0198005 A1 | * | 10/2003 | Sago et al. | 361/234 |
| 2005/0042881 A1 | * | 2/2005 | Nishimoto et al. | 438/710 |
| 2005/0082000 A1 | | 4/2005 | Moriya | |
| 2006/0066247 A1 | * | 3/2006 | Koshiishi et al. | 315/111.21 |

FOREIGN PATENT DOCUMENTS

| | | |
|---|---|---|
| JP | 2-35438 | 3/1990 |
| JP | 10-189699 | 7/1998 |
| JP | 2002-280365 A1 | 9/2002 |
| JP | 2004-260159 | 9/2004 |
| JP | 2005-101539 A1 | 4/2005 |
| JP | 2005-277400 A1 | 10/2005 |
| WO | 2006/049954 | 5/2006 |

OTHER PUBLICATIONS

International Search Report for International Application No. PCT/JP2007/059718 dated May 28, 2007.
Notification of Reasons for Refusal received in counterpart application No. 2008-515527 from the Japanese Patent Office dated May 15, 2012 with English translation (4 pages).

* cited by examiner

*Primary Examiner* — Ram N. Kackar
(74) *Attorney, Agent, or Firm* — Kratz, Quintos & Hanson, LLP

(57) ABSTRACT

To provide a technique which cleans an attracting face of a mechanism for electrostatically attracting an object to be processed inside a vacuum processing apparatus and keeps its attracting force constant. The method of the present invention is for cleaning an attracting face of a hot plate which holds the object to be processed inside a vacuum processing chamber through electrostatic attraction. The invention method includes a step of cleaning the attracting face of the hot plate by applying a high-frequency electric power of 13.56 MHz to a metallic base arranged under and near the hot plate in a state in which a cleaning gas is introduced into the vacuum processing chamber.

4 Claims, 3 Drawing Sheets

CLEANING METHOD AND A VACUUM PROCESSING APPARATUS

The present invention is a Continuation of International Application No. PCT/JP2007/059718 filed May 11, 2007, which claims priority to Japan Patent Document No. 2006-135436, filed on May 15, 2006. The entire disclosures of the prior applications are hereby incorporated by reference herein in their entireties.

BACKGROUND

The present invention generally relates to a technique for cleaning a mechanism for electrostatically attracting an object to be processed and performing a temperature control in a vacuum processing apparatus to be used in a semiconductor-producing process (such as, e.g., sputtering, chemical vapor deposition (CVD), etching or ion plantation).

Recently, problems which had been avoided, have conspicuously appeared in design rules the semiconductor devices.

One example is the issue concerning particles being transferred onto a rear face of a wafer.

Main issues concern the contamination of a washing tank by the particles peeled when the wafers are washed and mutual contamination of wafers, and contamination caused through defocusing in a lithography step.

In order to reduce such transferred particles, it is important to keep the temperature of wafers constant during processing in a processing chamber under a reduced pressure (hereinafter referred to as "processing") so that an acceptance percentage of chips obtained from a single wafer having a low contact rate may be maintained.

As one of means to enable such a processing, a heating plate having an electrostatically attracting function (hereinafter referred to as "hot plate") has been heretofore used.

The sputtering apparatus as one of the semiconductor-producing apparatuses has a vacuum processing chamber reduced to a predetermined pressure; and a mechanism for heating and cooling a semiconductor wafer disposed in the vacuum processing chamber.

The temperature control at the time of the film-forming processing is very important from the standpoint of stabilizing the quality of the films; and consideration must be made for the quantity of heat inputted from plasma to the wafer and the transfer of the quantity of heat supplied from the hot plate to the wafer (heat transfer).

In order to satisfy the above state, the heat transfer between the hot plate and the wafer needs to be maximized. As a means to accomplish such heat transfer, it is effective to set the contact areas of the hot plate and the wafer at 1:1.

In the actual processing, problems, such as, "a warp" and "a shape (notch or orientation flat)" of a substrate which have been processed through plural steps, worked accuracy of parts which constituting the apparatus, and a positional precision of a transfer robot are must be considered. It is feared that a metallic film is adhered to an attracting face side of the hot plate, the increase in the particles being transferred, and abnormal discharging occurs, which hinders the delivery of the wafers in the worst case.

Under these circumstances, it is a common practice in such an apparatus that the maximum diameter of the wafer is made greater than the maximum outer diameter of the attracting face of the hot plate.

Further, in order to control the temperature of the wafer during the processing, the quantity of heat inputted from the plasma to the wafer must be considered, and the heat transfer between the wafer and the hot plate needs to be optimized.

In order to improve the heat transfer between the wafer and the hot plate, it is important to increase the contacting face between the wafer and the hot plate. A mechanical clamping, electrostatic attraction or the like can be considered as an ordinary means; and usually, the electrostatically attracting system has been conventionally used from the standpoint of produced particles.

However, increasing the contact areas and the attracting power to enhance the heat transfer leads to the increase in particles being transferred onto the rear face of the wafer as a face for attraction, and it is clear that this problem leads to adverse effect in the yield of semiconductor devices which will become more miniaturized in the future.

Therefore, design considerations are such that particles transferred onto the rear face are to be reduced. However, such designs reduce the attracting areas to the minimum, which is contrary to the concept of increasing the heat transfer.

Under such circumstances, for the purpose of making up for the decreased contact areas (heat transfer), it has been the practice recently for gas to be introduced between a wafer and a hot plate; and heat transfer is carried out therebetween via the gas.

In this case, the processing is carried out through plural process modules in a single apparatus due to the attributes of the sputtering process; and the process temperatures frequently differ in the respective modules. Consequently, the temperature of the wafer immediately after it is transferred into the module differs from the set temperature (process temperature) of the hot plate, so that frictional electrification occurs at the time of electrostatic attraction, and a transfer error is caused by the poor removal of the wafer. Accordingly, the insulating resistance value of the attracting face needs to be set in a Johnson-Rahbeck range.

In addition, because the temperature of the wafer needs to be raised to the processing temperature until the sputtering, the electrostatically attracting system has to be of a bipolar specific.

The semiconductor wafer is repeatedly processed by various steps (such as, exposure, film formation, etching, washing, etc.). During the processings, attachment of an electroconductive material on the rear face of the wafer cannot be avoided.

Furthermore, organic materials (such as, Low-k materials) have been recently used as semiconductor constituting materials. In the case of such a material, when the wafer is to be processed with the hot plate placed in an apparatus module, the electrostatic attracting force between the wafer and the hot plate is intentionally increased. Thus, it is easily presumed that an electroconductive material at the rear face of the wafer is easily transferred to the attracting face of the hot plate.

Meanwhile, when the chamber is baked on starting up the module after maintenance in the open atmosphere, the electroconductive material is contained in a material peeled from constituting parts (adhesion-preventing plate, chamber wall).

In this way, the electroconductive material transferred onto the hot plate forms a low-resistance layer on the outermost face of the hot plate.

Because such a low-resistance layer exhibits a resistance lower than a resistance of an insulating layer (hereinafter referred to as dielectric layer) of the attracting face of the hot plate, in the case of the attracting force due to the Jonson-Rahbeck force utilizing inducing charges onto the outermost face of the dielectric layer by controlling the resistance value in order to flow minute electric currents between ESC electrodes and between the wafer and the ESC electrodes depend on the resistance of dielectric layer, the electroconductive material shortcuts between ESC electrodes, and a condenser circuit is not formed between the ESC electrodes.

Therefore, lines of electric force between the wafer and the ESC electrodes terminate at the ESC electrodes; and consequently, no attracting force appears because no charging polarization takes place at the surface of the wafer.

Meanwhile, when the sectional structure of the attracting face of the hot plate to be used in this kind of apparatus is observed, it is an embossed structure to minimize the particles transfer onto the rear face of the wafer.

The directly contacting face to the wafer comprises top faces of projections, at which an implementing electrostatically attracting force operationally needed is obtained.

On the other hand, although the attracting force is generated even at bottom portions of depressions of the attracting face of the hot plate, it is very weak (and it is generally called a "spatial force") because the force is inversely proportional to the distance up to the wafer (and a potential between the wafer cannot be specified).

When a low-resistance layer is attached to this embossed attracting face of the hot plate, it is difficult to remove the layer even by using WET washing at the outside because the sectional shape is very complicated.

As a result, the electrostatically attracting force is not generated or lowered so that inconveniences occur such that the temperature of the wafer not rising within a predetermined time period, and the temperature of the wafer not being able to be controlled to a constant level during a plasma processing, etc.

Because the low-resistance layer formed on the attracting layer depends on the user's processing (such as, a carried amount, the temperature of the hot plate, the processing time periods, etc.) and there are large variations among the apparatuses or the modules, it is difficult to confirm the attached state.

As mentioned above, the electroconductive material carried into the vacuum processing apparatus with the wafer needs to be removed in order to maintain a stable attracting force.

Due to such problems, a cleaning method is heretofore proposed, which performs steps of plasma etching by applying a high-frequency electric power to an attracting electrode of an electrostatic chuck, placing a substrate on this electrostatic chuck and carrying out the substrate having been placed on the electrostatic chuck at the substrate-placing step (For example, see JP-A 2002-280365).

SUMMARY OF THE INVENTION

The present invention, which has been made to solve these problems of the prior art, is aimed at providing a technique which cleans an attracting face of a mechanism which electrostatically attracts an object to be processed inside a vacuum processing apparatus and keeps its attracting force constant.

The present invention, which has been accomplished to realize the above-mentioned object, is directed to a cleaning method for cleaning an attracting face of an electrostatically attracting portion, which holds an object to be processed inside a vacuum processing chamber by electrostatic attraction. The cleaning method of this invention includes arranging a cleaning electrode made of a metal near the electrostatically attracting portion, applying a high-frequency electric power to the cleaning electrode in the state such that a cleaning gas is introduced into the vacuum processing chamber, and thereby cleaning the attracting face of the electrostatically attracting portion.

In the above invention, according to the present invention, a gas which does not chemically react with constituting parts of the vacuum processing chamber when being ionized is used as the cleaning gas.

In the above invention, according to the present invention, an electrostatically attracting portion having a heater is used as the above electrostatically attracting portion.

Further, the present invention is directed to a vacuum processing apparatus comprising a vacuum processing chamber into which a cleaning gas can be introduced, an electrostatically attracting portion which is provided inside the vacuum processing chamber and the electrostatically attracting portion holds an object to be processed through electrostatic attraction, a cleaning electrode made of a metallic material and disposed adjacent to the electrostatically attracting portion, and a high-frequency electric power source which applies a high frequency electric power to the cleaning electrode.

In the above invention, according to the present invention, the electrostatically attracting portion can include a heater.

In the above invention, according to the present invention, the cleaning electrode is configured as a base for supporting the electrostatically attracting portion.

In the above invention, according to the present invention, a protecting portion for protecting the cleaning electrode from ions of the cleaning gas can be provided between the cleaning electrode and the electrostatically attracting portion.

In the present invention, the metallic cleaning electrode is disposed near the electrostatically attracting portion inside the vacuum processing chamber, and the high-frequency electric power is applied to the cleaning electrode in such a state that the cleaning gas is introduced inside the vacuum processing chamber.

Accordingly, plasma is generated above the attracting face of the electrostatically attracting portion; an ion component of the discharge gas kind generated by an ionizing action of the plasma clashes with the attracting face of the electrostatically attracting portion as a cathode face; the pulled-in ion component collides with an impurity (an electroconductive material) attached to the attracting face of the electrostatically attracting portion at a high speed; and this impurity is hit and physically flies off (generally called "inverse sputtering").

According to the present invention, because the attracting face of the electrostatically attracting portion inside the vacuum processing apparatus can be cleaned, the resistance value of the attracting face can be always kept constant; that is, an electric current flowing between the attracting electrodes inside the electrostatically attracting portion and between the attracting electrodes and the object to be processed can be always kept constant. Therefore, the object to be processed can be stably held through the attraction in the processing, thereby enhancing the reliability of the processing.

Particularly, according to the present invention, before and after various processings, the attracting face of the electronically attracting portion can be assuredly and rapidly cleaned in the vacuum atmosphere.

In the present invention, when the electrostatically attracting portion has a heater, the temperature of the object to be processed, such as a wafer, can be kept constant during the processing, so that particles transferred to the object to be processed can be reduced.

Furthermore, in the present invention, when the cleaning electrode is configured as the base for supporting the electrostatically attracting portion, cleaning can be carried out by uniformly performing etching on the attracting face of the electrostatically attracting portion.

In other words, as to the electrode to which the high-frequency electric power is applied, application of the power to an attraction electrode buried in the electrostatically attracting portion is conceivable. However, when this technique is employed with increase in the size of the substrates, variations occur in the ions clashing within the attracting face of the electrostatically attracting portion, so that there are differences in the degree of removing the electroconductive material on the attracting face as the etching substance and the etching effect cannot be sufficiently exhibited.

Moreover, if the etching is excessively performed, the plasma comes to be concentrated at a non-uniform shape portion of the attracting face of the electrostatically attracting portion. Consequently, the temperature rapidly rises, so that an intergranular fracture and grain dropping are induced in the constituting substrate made of, e.g., AlN, which may cause insulation breakdown and particles.

In a case where the cleaning electrode is configured as the base for supporting the electrostatically attracting portion as in the present invention, the high-frequency waves are applied to the entire electrostatically attracting portion by inducing the high-frequency waves up to the electrostatically attracting portion due to a skin effect of the high-frequency waves.

Furthermore, when the protecting portion for protecting the cleaning electrode from the ions of the cleaning gas is provided between the cleaning electrode and the electrostatically attracting portion in the present invention, the ionized ion component does not directly enter the cleaning electrode, and its metallic portions are not abraded.

According to the present invention, because the attracting face of the mechanism for electrostatically attracting the object to be processed in the vacuum processing chamber is cleaned, its attracting force can be kept constant.

DETAILED DESCRIPTION OF THE INVENTION

In the following detailed description, a preferred embodiment of the present invention will be explained in detail with reference to the drawings.

The present invention can be applied to various vacuum processing apparatuses (such as, a sputtering apparatus, a CVD apparatus, an etching apparatus, an ionplantation apparatus or the like, for example).

Figure 1:
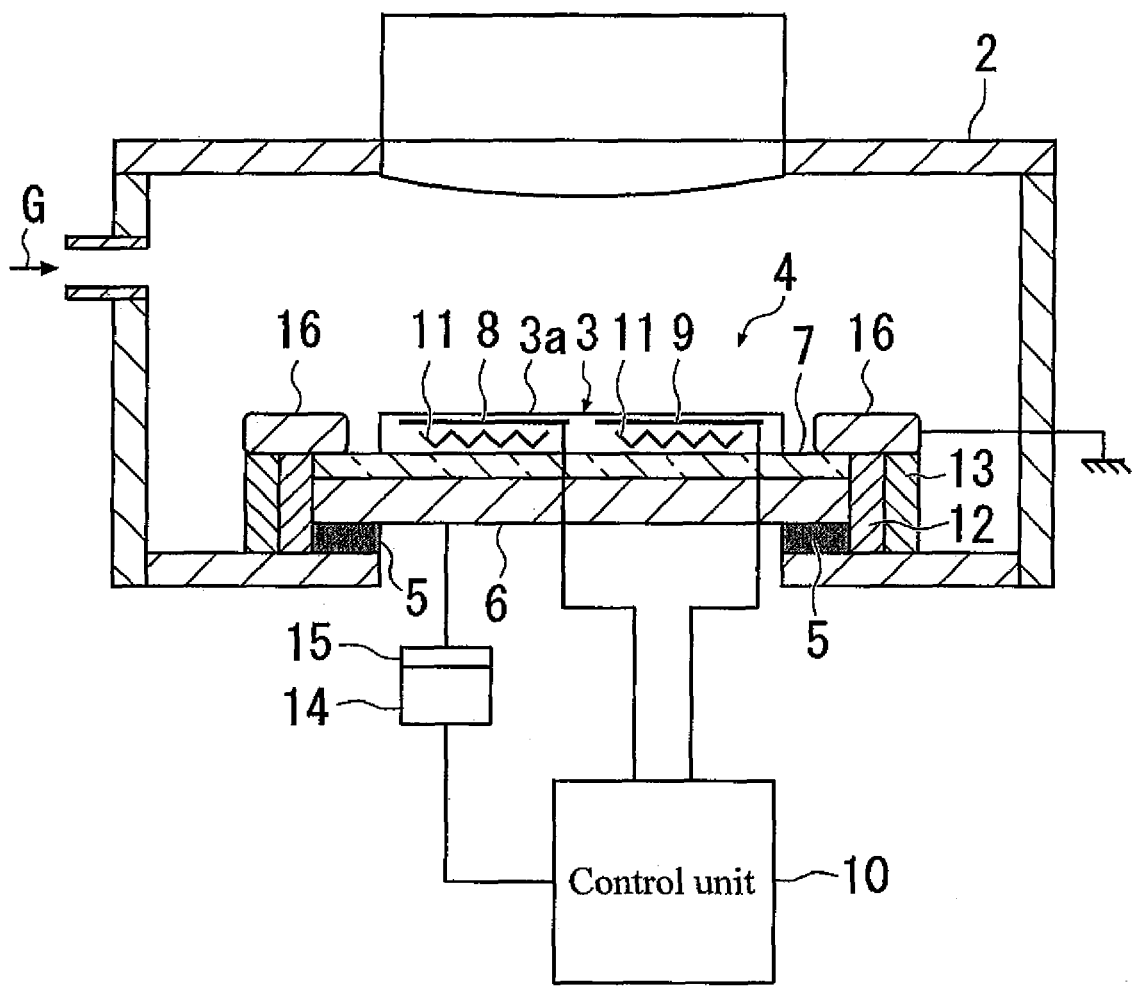
FIG. 1 is a schematic figure of the construction of an embodiment of the vacuum processing apparatus according to the present invention.
Figure 2:
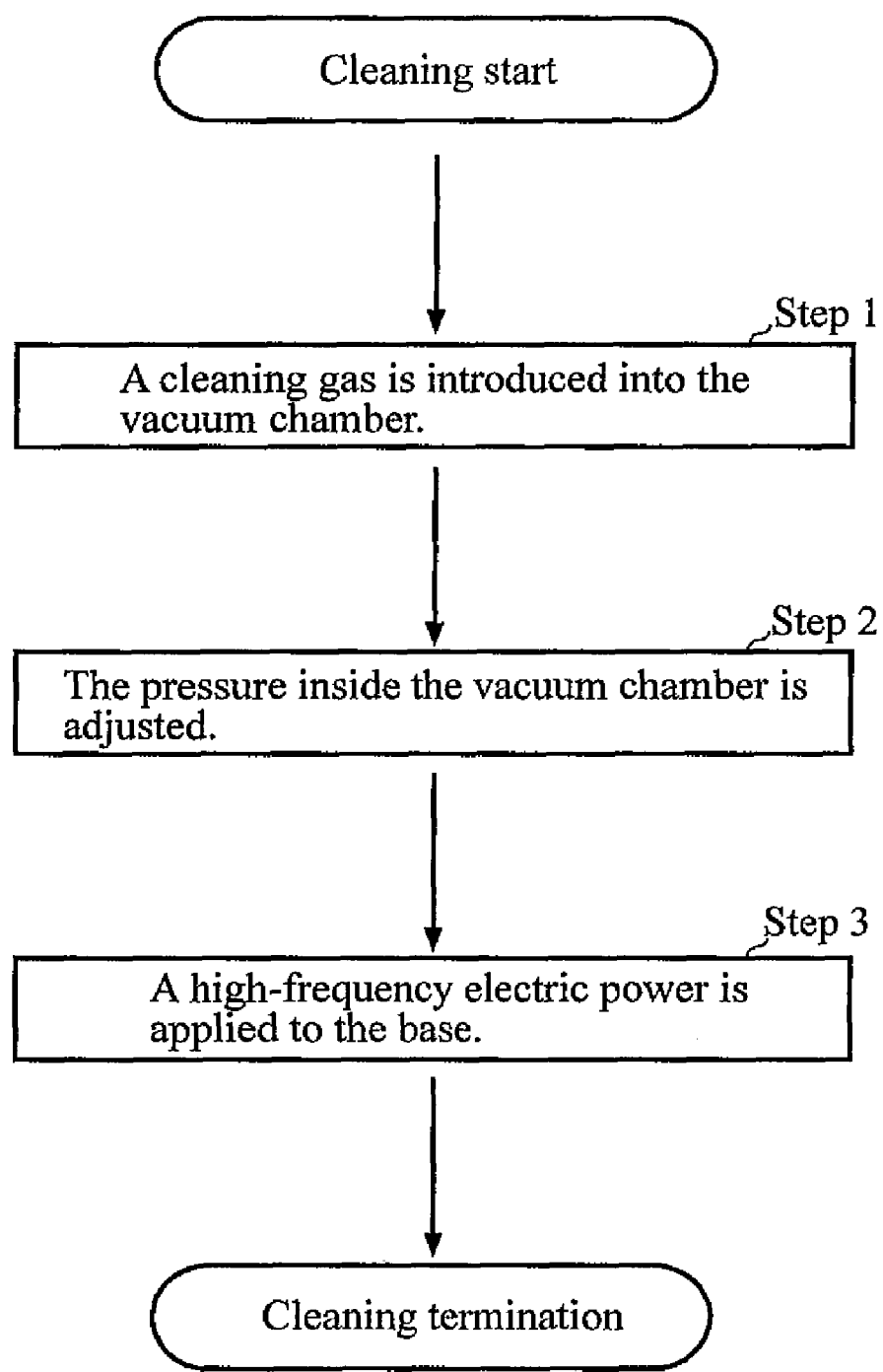
FIG. 2 is a flowchart showing one example of the cleaning method according to the present invention.

FIG. 1 is a schematic figure of the construction of an embodiment of the vacuum processing apparatus according to the present invention; and FIG. 2 is a flowchart showing an example of the cleaning method according to the present invention.

As shown in FIG. 1, the vacuum processing apparatus 1 of the present embodiment is connected to a vacuum evacuation system (not shown), and includes a vacuum processing chamber 2 into which a cleaning gas G can be introduced.

A susceptor 4 is disposed in a lower portion in the vacuum processing chamber 2. This susceptor 4 has a hot plate (electrostatically attracting/heating portion) 3 for attracting and holding an object to be processed (not shown) on an attracting face 3a.

In the case of this embodiment, referring to the susceptor 4, a base (cleaning electrode) 6 in a discoid shape, for example, is provided on an insulating plate 5 set on a bottom portion of the vacuum processing chamber 2, and a thin discoid protecting member 7 is disposed entirely on this base 6.

In the present invention, the material of the protecting member 7 is not particularly limited, but one made of quartz is preferably used from the standpoint of preventing metallic contamination through being exposed to the plasma.

Further, the hot plate 3 is fixed on the protecting member 7, so that the base 6 as the cleaning electrode is arranged under, near and adjacent to the hot plate 3 via the protecting member 7.

The hot plate 3 to be used in this embodiment is constituted by a ceramic material composed mainly of, for example, aluminum (Al). Bipolar type attracting electrodes 8, 9 are provided inside this hot plate 3.

In this embodiment, each of the attracting electrodes 8, 9 is connected to a control unit 10, respectively, and a predetermined voltage is to be supplied through this control unit 10.

A heater 11 for temperature controlling (heating) is provided inside the hot plate 3. This heater 11 is connected to the above mentioned control unit 10, and is controlled to a predetermined temperature (details not shown).

In addition, the base 6 and the protecting member 7 are made to be larger than hot plate 3 (for instance, to be almost same size as the hot plate 3). Then, the base 6 and the protecting member 7 are located and fixed by locating members 12 and 13 provided around them.

The base 6 of this embodiment is made of a metallic material such as stainless or the like, for example. This base 6 is held in an electrically floating state, and connected to a high-frequency electric power source 14.

This high-frequency electric power source 14 has a high-frequency switching element portion 15, for example, a relay system; and the high-frequency electric power source 14 is connected to the above control unit 10. Then, the high-frequency electric power of, e.g., 13.56 MH is applied to the base 6 according to a signal from the control unit 10.

Furthermore, a ring-shaped attachment-preventing plate (platen ring) 16 made of a metallic material is arranged around the hot plate 3.

This attachment-preventing plate 16 is grounded to have an earth potential, so that the plasma is prevented from entering at the time of cleaning.

In the present embodiment having such a structural arrangement, the cleaning gas G is introduced into the vacuum processing chamber 2 as shown in Step 1 of FIG. 2.

In the present embodiment, the kind of cleaning gas G introduced is not particularly limited, but a gas which does not chemically react with the parts that make up the vacuum processing chamber 2 when being ionized is preferably used from the standpoint of minimizing the occurrence of the particles. As such a gas, inert gases (such as, argon (Ar), nitrogen ($N_2$) or the like) are used, for example.

Then, in Step 2, the pressure inside the vacuum processing chamber 2 is adjusted to a predetermined pressure.

Here, the pressure inside the vacuum processing chamber 2 is preferably adjusted to 1 to 20 Pa for ease of generating discharges and suppressing the reduction in temperature of the hot plate 3 when the cleaning gas G is introduced.

Next, in Step 3, the high-frequency electric power having 13.56 MHz is applied to the base 6 from the high-frequency electric power source 14.

In the present invention, no limitation is particularly posed, but it is preferable to adjust the applied high-frequency electric power of 50 to 150 W and the high-frequency electric power applying time period of 60 to 90 seconds from the standpoint of attaining a practically sufficient etching grade and on the other hand suppressing the particles generated when the surface of the hot plate 3 is hit by the inverse sputtering.

Plasma is generated above the attracting face 3a of the hot plate 3 by applying the high-frequency electric power to the base 6 under the above-described condition.

As a result, the ion component of the discharged gas generated by the ionizing action of this plasma hits the attracting face 3a of the hot plate 3 as the cathode face; the ion component taken in is impinged on the impurity (electroconductive material) attached to the attracting face 3a of the hot plate 3; and this impurity is physically hit and flies off.

According to the present embodiment, because the attracting face 3a of the hot plate 3 inside the vacuum processing apparatus can be cleaned in this manner, the resistance value of the attracting face 3a can always be kept constant. In other words, since the electric currents flowing between the attracting electrodes 8, 9 inside the hot plate 3 and between the attracting electrodes 8, 9 and the object to be processed (not shown) can always be kept constant, the object to be processed can be stably attracted and held when being processed and the reliability of the processing can thereby be enhanced.

Particularly, according to the present embodiment, the attracting face 3a of the hot plate 3 can be assuredly and rapidly cleaned in the vacuum ambience before and after various processings.

Further, in the vacuum processing apparatus 1 of the present embodiment, since the object to be processed is attracted by the hot plate 3 having the heating heater 11, the temperature of the object to be processed can be kept constant during the processing, so that the particles transferred onto the object to be processed can be reduced.

Furthermore, in this embodiment, since the base 6 which is larger than the hot plate 3 and supports the hot plate from the lower portion on a side opposite to the attracting face 3a is constituted as the cleaning electrode, the high-frequency waves can be applied to the entire hot plate 3, so that it is possible to make the uniform cleaning on the attracting face 3a of the hot plate 3 by etching.

In addition, in the present embodiment, because the protecting member 7 which protects the base 6 from the ions of the cleaning gas is provided between the base 6 and the hot plate 3, the ionized ion component does not directly enter the base 6, and its metallic portions are not abraded.

Meanwhile, the present invention is not limited to the above-mentioned embodiment, and various modifications can be made.

For example, in the above embodiment, the high-frequency electric power is applied to the base 6 as the cleaning electrode when cleaning, but the present invention is not limited thereto. While the high-frequency electric power is applied to the cleaning electrode, the high-frequency electric power can be also applied to the attracting electrode.

It is preferable to apply the high-frequency electric power, without causing an excessive etching, to the extent that no variation occurs in the ions hit within the attracting face of the electrostatic attracting portion.

Furthermore, the cleaning by the present invention can be performed either before or after the processing (such as sputtering or the like).

EXAMPLE

Figure 3:
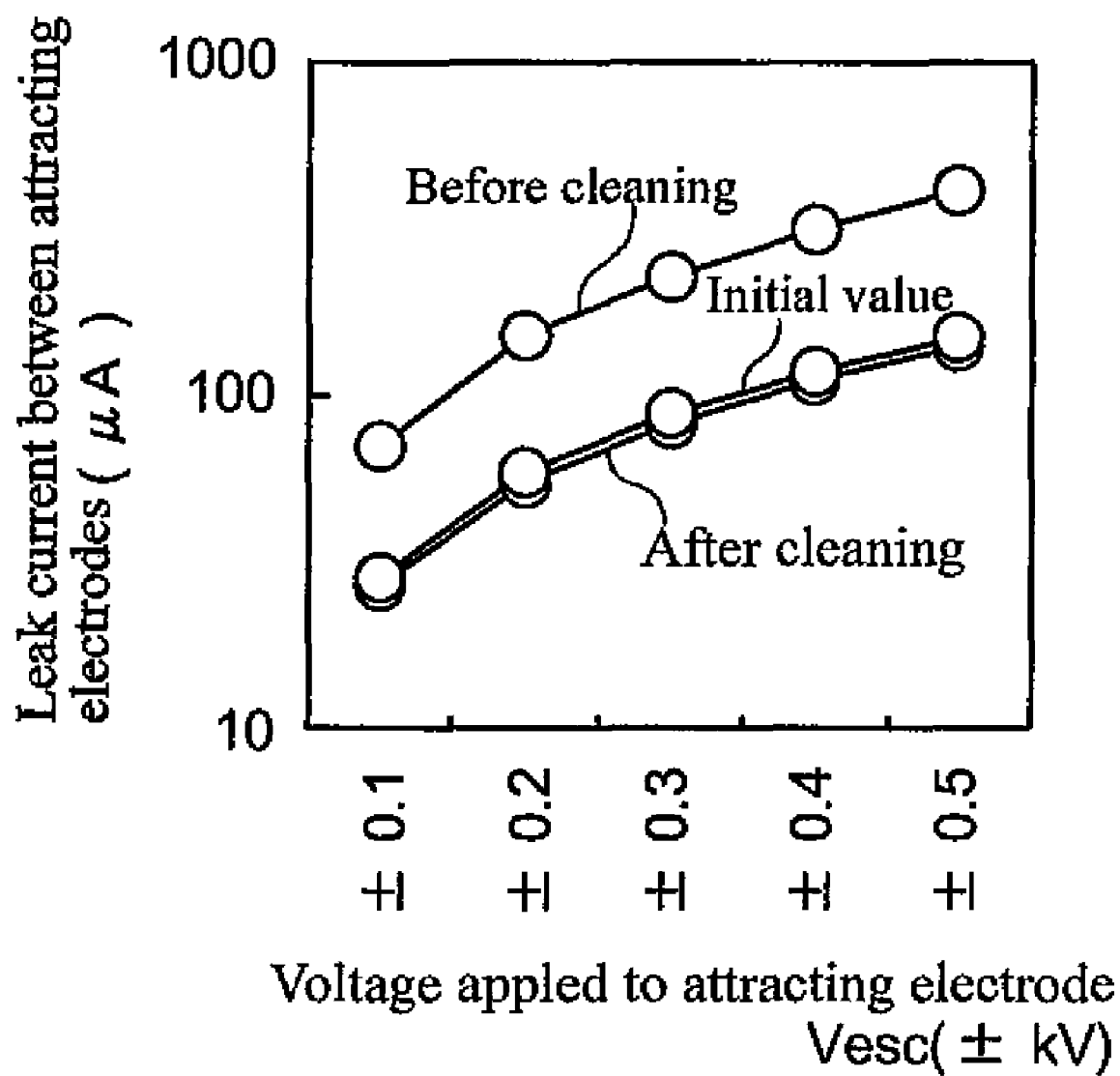
FIG. 3 is a graph showing results of an Example.

FIG. 3 is a graph showing results of an example of the present invention.

In this case, a vacuum processing apparatus having the construction shown in FIG. 1 is used, and cleaning is performed by applying the high-frequency electric power to the base under the following condition: pressure 10 Pa, frequency 13.56 MHz and power 0.1 kW.

When the electroconductive material is attached to the surface of the hot plate, the resistance value between the attracting electrodes increases from the initial value as shown in FIG. 3. The current between the attracting electrodes is decreased by the above cleaning treatment, and the resistance is returned to the initial value.

As described above, it can be confirmed that the attracting face of the electrostatically attracting/heating portion can be assuredly cleaned according to the present invention.

What is claimed is:

1. A vacuum processing apparatus, comprising:
    a vacuum processing chamber into which a cleaning gas can be introduced;
    an electrostatically attracting portion provided inside the vacuum processing chamber, the electrostatically attracting portion holding an object to be processed through electrostatic attraction;
    a cleaning electrode made of a metallic material and disposed adjacent to the electrostatically attracting portion; and
    a high-frequency electric power source which applies a high frequency electric power to the cleaning electrode,
    wherein a protecting portion for protecting the cleaning electrode from ions of the cleaning gas is provided between the cleaning electrode and the electrostatically attracting portion, the protecting portion being larger than the electrostatically attracting portion in surface area;
    a ring shaped attachment preventing plate arranged on the protecting portion and around the electrostatically attracting portion, and electrically grounded and disposed on the protecting member along its outer periphery; and
    a main surface of the protecting portion has a substantially same surface area with a main surface of the cleaning electrode
    wherein the protecting member and the cleaning electrode are fixed to the apparatus with a locating member that forms a band around both the protecting member and the cleaning electrode, and the ring shaped attachment preventing plate is in contact with an upper surface of the locating member and a periphery of an upper surface of the protecting portion.

2. The vacuum processing apparatus according to claim 1, wherein the electrostatically attracting portion has a heater.

3. The vacuum processing apparatus according to claim 1, wherein the cleaning electrode is configured as a base for supporting the electrostatically attracting portion.

4. The vacuum processing apparatus according to claim 1, wherein the protecting portion covers substantially an entire bottom surface of the electrostatically attracting portion.

* * * * *